United States Patent [19]
Koifman et al.

[11] Patent Number: 5,598,118
[45] Date of Patent: Jan. 28, 1997

[54] DRIVER CIRCUITS FOR SWITCHING TRANSISTORS

[75] Inventors: Vladimir Koifman, Rishon-Lezion; Israel Kashat, Netanya; Yachin Afek, Kfar Saba, all of Israel

[73] Assignee: Motorola, Inc., Schaumburg, Ill.

[21] Appl. No.: 326,910

[22] Filed: Oct. 21, 1994

[30] Foreign Application Priority Data

Nov. 5, 1993 [GB] United Kingdom .................. 9322878

[51] Int. Cl.⁶ .......................... H03B 1/00; H03K 17/687
[52] U.S. Cl. .......................... 327/108; 327/404; 327/427
[58] Field of Search .................. 327/58–62, 65, 327/74, 108, 111, 403–405, 407–413, 427, 434–437, 574, 581, 337, 554, 148, 390, 536, 589

[56] References Cited

U.S. PATENT DOCUMENTS

| | | | |
|---|---|---|---|
| 3,789,244 | 1/1974 | Provanzano | 327/391 |
| 4,803,462 | 2/1989 | Hester et al. | 327/407 |
| 5,157,291 | 10/1992 | Shimoda | 327/408 |
| 5,412,692 | 5/1995 | Uchida | 327/58 |

FOREIGN PATENT DOCUMENTS

| | | |
|---|---|---|
| 2249233 | 4/1992 | United Kingdom . |
| 2264011 | 8/1993 | United Kingdom . |

*Primary Examiner*—Toan Tran
*Attorney, Agent, or Firm*—Harry A. Wolin; Rennie William Dover

[57] ABSTRACT

A driver circuit (8) is arranged to switch a transistor (10) of a switched capacitor circuit, or transistors (62 and 64) of a differential switched capacitor circuit, between a first state, in which the transistor switch is closed whereby an input signal (VINP) is transferred to an output, and a second state, in which the transistor switch is open. The driver circuit includes a maximum and a minimum selection (12, 14) between the input signal and a reference voltage (VAG), a voltage shift element (26), and switches (16, 18, 20, 22, 24), coupled to receive the input signal (VINP) and to the gate electrode of the transistor switch (10), which ensures that the gate-to-source voltage of the transistor switch (10), in the first and second states, is independent of the input signal (VINP).

21 Claims, 4 Drawing Sheets

5,598,118

DRIVER CIRCUITS FOR SWITCHING TRANSISTORS

This invention relates to driver circuits for transistor switches, such as those used in switched capacitor circuits or differential switched capacitor circuits.

BACKGROUND OF THE INVENTION

A part of a switched capacitor circuit is shown in FIG. 1. The circuit comprises a capacitor 2 which is connected to an input pin via a transistor switch 4 and to a reference voltage, analog ground VAG, via a transistor switch 6. The capacitor is connected to an output pin, which may be connected to the input of an operational amplifier or other switching stage, depending upon the application. The gate of transistor switch 4 is coupled to receive a switch control signal PH0 and the gate of transistor switch 6 is connected to receive the inverse of the switch control signal PH1. When the switch control signal is high, capacitor 2 is charged from the input pin. When the switch control signal is low, the capacitor discharges to analog ground VAG.

When the transistor switch 4 is 'on', the voltage on its gate is fixed, but the voltage on its drain and source is changing according to the signal VINP at the input pin. This means that the resistance between the source and drain of the transistor switch 4 (hereinafter the source-drain on-resistance) also varies according to the input signal. Thus, the RC constant, during charging of the capacitor 2, is changing according to the input signal VINP. This can produce non-linear distortions.

Such distortions are particularly problematical in mixed-signal integrated circuits (ICs): that is, ICs that process both analog and digital signals. The analog parts of such ICs operate in extremely noisy digital environments, due to the digital noise and voltage spikes which penetrate to the analog part and which are rapidly changing. Since the RC constant depends on the input signal, the sampled spike voltage on the capacitor also depends on the input signal. Hence the voltage on capacitor 2 depends non-linearly on the input signal, which results in non-linear distortions.

In some designs, the transistors 4 and 6 are replaced by a double transfer gate, in order to provide a larger input voltage range. However, the on-resistance of the double transfer gate also depends on the input signal, and thus, the same problems exist.

In some chips, a charge pump is used to generate a gate-to-source voltage for the transistor switch, which is substantially independent of the input signal. This ensures that the on-resistance of the transistor switch is substantially constant (neglecting the bulk effect). Since the charge pump generates voltages greater than the supply voltage, the MOS transistors, used in such a chip, suffer from electrical overstress. This reduces the reliability of the chip.

There is therefore a need to provide an improved driver circuit which provides constant gate to source voltage in the transistor switch, whilst ensuring that the voltages are no greater than the supplied voltage.

SUMMARY OF THE INVENTION

In accordance with the first aspect of the present invention there is provided a driver circuit for switching a transistor from a first state in which the transistor switch is closed such that an input signal is transferred to an output and a second state in which the transistor switch is open, the driver circuit comprises:

a first reference node for receiving a first reference voltage signal;

a second reference node for receiving a second reference voltage signal;

maximum detection means coupled to receive the input signal and the first reference voltage signal and for providing at an output the greater of the two signals, the output of the maximum detection means being selectively coupled to the gate electrode of the transistor switch;

minimum detection means coupled to receive the input signal and the first reference voltage signal and for providing at an output the lesser of the two signals;

voltage shifting means having an input selectively coupled to the second reference node and to the output of the minimum detection means and an output coupled to the gate electrode of the transistor switch;

wherein in the second state the output of the maximum detection means is coupled to the gate electrode of the transistor switch and the output of the voltage shifting means and the input of the voltage shifting means is coupled to the second reference voltage signal, and wherein in the first state, the output of the minimum detection means is coupled to the input of the voltage shifting means such that the output of the voltage shifting means is shifted by the minimum output signal to a voltage level which corresponds to the difference between the second reference voltage signal and the minimum output signal such that the voltage on the gate electrode of the transistor switch is dependent on the maximum output signal, and the signal at the output of the voltage shifting means whereby the gate-to-source voltage of the transistor switch is independent of the input signal.

Thus, the driver circuit in accordance with the present invention provides constant gate-to-source voltage in the transistor switch.

Preferably, the driver circuit switches the transistor switch between the first state and the second state in response to a switching signal have a first signal level and a second signal level respectively. The driver circuit further comprises:

a first switch coupled to receive the switching signal and coupled between the output of the maximum detection means and the gate electrode of the transistor switch such that when the switching signal has the second signal level the first switch is closed and the maximum output signal is coupled to the gate electrode and when the switching signal has the first signal level the first switch is open; and a second switch coupled to receive the inverse of the switching signal and coupled between the output of the minimum detection means and the input of the voltage shifting means such that when the switching signal has the second signal level, the second switch is open and when the switching signal has the first signal level, the second switch is closed and the minimum output signal is coupled to the input of the voltage shifting means.

In a preferred arrangement, the first switch comprises a first transistor of a first conductivity type and having a first current electrode coupled to the output of the maximum detection means, a second current electrode coupled to the gate electrode of the transistor switch, a bulk electrode coupled to the first current electrode and a gate electrode; a second transistor of the first conductivity type having a first current electrode coupled to the output of the maximum detection means, a second current electrode coupled to the gate electrode of the first transistor, a bulk electrode coupled to the bulk electrode of the first transistor and a gate electrode coupled to receive the switching signal; and a third transistor of a second conductivity type having a first current electrode coupled to the gate electrode of the first transistor, a second current electrode coupled to a third reference voltage supply and a gate electrode coupled to receive the switching signal.

As discussed in the introduction, a driver circuit used in some chips generates voltages which are greater than the power supply and in such a way that leads to excessive voltage stresses in the transistor switches, which causes unsatisfactory reliability of the chip. This problem may lead to chip failure after a period of time. The preferred embodiment of the present-invention provides rail-to-rail operation such that all voltages, between any two adjacent nodes, are no greater than the supply voltage. This is due to the bulk electrode arrangement of the first and second transistors of the first switch.

A driver circuit in accordance with the present invention for a differential switched capacitor circuit is also disclosed herein.

BRIEF DESCRIPTION OF DRAWINGS

Two driver circuits in accordance with the present invention will now be described, by way of example, with reference to the accompanying drawings in which.

DETAILED DESCRIPTION OF THE DRAWINGS

Figure 1:
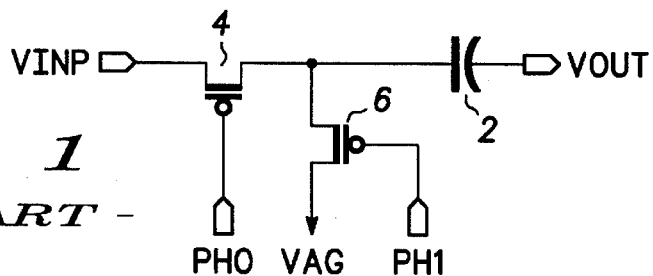
FIG. 1 is a schematic circuit diagram of a prior art switched capacitor circuit.
Figure 2:
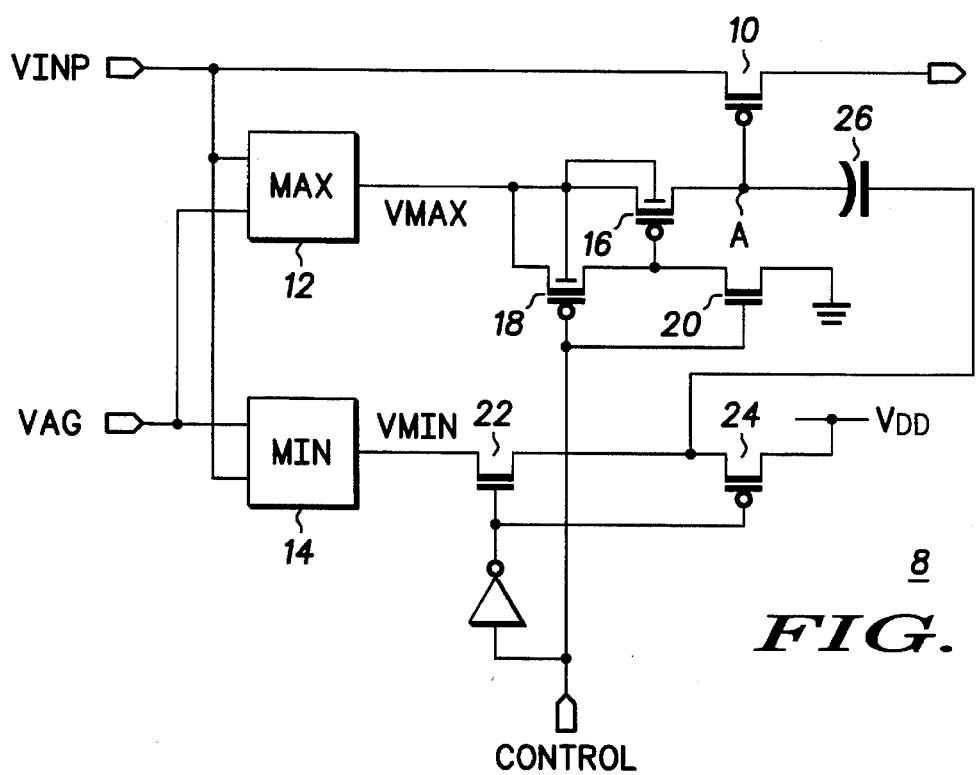
FIG. 2 is a schematic circuit diagram of a first driver circuit in accordance with the present invention for switching a transistor.

Referring now to FIG. 2, a driver circuit 8 in accordance with a preferred embodiment of the invention, for switching a transistor 10, comprises a maximum detection circuit 12 and minimum detection circuit 14. The transistor switch 10 has a source electrode coupled to receive an input signal VINP at an input pin and a drain electrode for coupling to a capacitor (not shown) of a switched capacitor circuit, such as that shown in FIG. 1.

The maximum detection circuit 12 has a first input coupled to receive the input signal VINP and a second input coupled to a first reference voltage supply, analog ground VAG. The minimum detection circuit 14 has a first input coupled to receive the input signal VINP and a second input coupled to analog ground VAG. Analog ground VAG is a voltage level relative to which the input signal VINP changes.

The maximum detection circuit 12 determines which of the two signals at its inputs is the greater and provides the maximum determined signal VMAX at an output thereof. The minimum detection circuit 14 determines which of the two signals at its inputs is the smaller and provides the minimum determined signal VMIN at an output thereof.

The output VMAX of the maximum detection circuit 12 is coupled to the source electrode of a first P-channel transistor 16 and to the source electrode of a second P-channel transistor 18. The drain electrode of the first P-channel transistor 16 is coupled to a node A, which is coupled to the gate electrode of transistor switch 10. The drain electrode of the second P-channel transistor 18 is coupled to the gate electrode of the first P-channel transistor 16 and to the drain electrode of a N-channel transistor 20.

The gate electrode of N-channel transistor 20 is coupled to the gate electrode of P-channel transistor 18, which is coupled to receive a switch control signal CONTROL. The source electrode of the N-channel transistor 20 is coupled to ground GND. The bulk electrode of the first P-channel transistor 16 is coupled to its source electrode and to the bulk electrode of the second P-channel transistor 18.

The output VMIN of the minimum detection circuit 14 is coupled to the source electrode of N-channel transistor 22, whose drain electrode is coupled to the drain electrode of a P-channel transistor 24. The gate electrodes of N-channel transistor 22 and P-channel transistor 24 are coupled to receive the inverse of the switch control signal CONTROL. The source electrode of P-channel transistor 24 is coupled to receive a second reference voltage, VDD.

A voltage shifting means has an input coupled to the drain electrodes of N-channel transistor 22 and P-channel transistor 24 and an output coupled to node A. Preferably, the voltage shifting means comprises a bootstrap capacitor 26, wherein one plate of the bootstrap capacitor 26 is coupled to the node A and another plate of the bootstrap capacitor 26 is coupled to the drain electrodes of N-channel transistor 22 and P-channel transistor 24.

The operation of the driver circuit 8 in accordance with the present invention will now be described with reference to FIG. 2. It is assumed that the input signal VINP changes slowly compared to the clock rate of the switch control signal. This is often the case in present oversampling A/D and D/A converters and various oversampling switched-capacitor filters, voltage references, etc. It is also assumed that the transistor switch 10 is an enhanced mode type of transistor. Furthermore, it is assumed that the capacitance of bootstrap capacitor 26 is much larger than the parasitic capacitance on the gate electrode of transistor switch 10.

When the switch control signal CONTROL is high, the second P-channel transistor 18 is 'off', the N-channel transistor 20 is 'on' whereby the gate electrode of the first P-channel transistor 16 is pulled low, which switches this transistor 16 'on'. The output of the maximum detection circuit 12 is therefore coupled to node A. The voltage on the gate electrode of the transistor switch 10 is therefore equal to the maximum determined voltage VMAX at the output of the maximum detection circuit 12. Since the gate potential is lower than the source potential, the transistor switch 10 is 'off'.

The signal on the gate electrode of N-channel transistor 22 is low, so that this transistor is 'off' and the P-channel transistor 24 is 'on'. One plate of the bootstrap capacitor 26 is therefore coupled to the second reference voltage VDD and the other plate is coupled to node A at the maximum determined voltage VMAX. The bootstrap capacitor 26 is therefore pre-charged to a voltage which represents the difference between VDD and the maximum determined voltage VMAX.

If the input signal VINP is less than analog ground VAG, then the maximum determined voltage VMAX, at the output of the maximum detection circuit 12, is VAG. Thus, the gate of the transistor switch 10 is at VAG potential. The potential on the drain electrode of transistor switch 10 is VAG, because the capacitor (not shown) to which the drain is connected is discharging and transistor 6 (of FIG. 1) is conducting. Since the drain potential is not lower than the gate potential, the transistor switch 10 is not conducting.

If the input signal VINP is greater than analog ground VAG, the output of the maximum detection circuit 12 is at VINP, so that the transistor switch 10 is also not conducting.

When the switch control signal CONTROL is low, the first P-channel transistor 16 is 'off', the N-channel transistor 22 is 'on' and the P-channel transistor 24 is 'off'. One of the plates of the bootstrap capacitor 26 is therefore coupled to the output VMIN of the minimum detector circuit 14, so that the voltage on this plate drops from VDD to the minimum determined voltage VMIN.

By charge conservation, the voltage at node A subsequently becomes equal to VMAX−(VDD−VMIN). Hence, the voltage VG on the gate electrode of transistor switch 10 drops from the VMAX (VINP or VAG) to, $$V_G = VMAX - (VDD - VMIN) \quad (1)$$

The gate-to-source voltage $V_{GS}$ of the transistor switch 10 is therefore equal to, $$V_{GS} = VINP - VMAX + VDD - VMIN \quad (2)$$

Since $$VMAX + VMIN = VAG + VINP$$

Then equation 2 becomes, $$V_{GS} = VDD - VAG \quad (3)$$

The driver circuit 8 in accordance with the present invention therefore ensures that, when the transistor switch 10 is 'on', the gate-to-source voltage is constant and independent from the input signal.

Since the bulk electrode of the first 16 and second 18 P-channel transistors are connected to their sources, there is no excess voltage stress in these transistors.

It will therefore be appreciated, that irrespective of whether the input signal VINP is greater than or less than VAG, when the transistor switch 10 is 'off', the gate potential of transistor switch 10 is not lower than the source or drain potential, and when the transistor switch 10 is 'on', the gate-to-source voltage is constant and independent of the input signal VINP.

Figure 3:
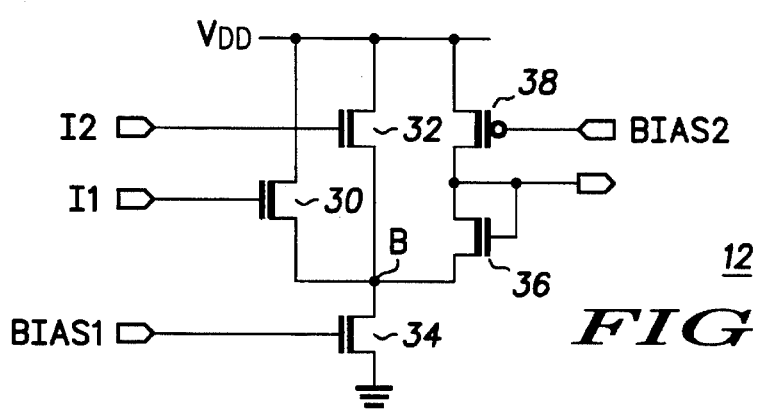
FIG. 3 is a schematic circuit diagram of a first maximum detection circuit for use in the circuit of FIG. 2.

An example of an implementation of the maximum detection circuit 12 is shown in FIG. 3.

The first and second inputs of the maximum detection circuit 12 are coupled respectively to the gate electrode of a first N-channel transistor 30 and to the gate electrode of a second N-channel transistor 32. The source electrodes of the first 30 and second 32 N-channel transistors are coupled to the second reference voltage VDD and the drain electrodes of the first 30 and second 32 N-channel transistors are coupled to a node B. A third N-channel transistor 34 is coupled between the node B and ground GND. The gate electrode of the third N-channel transistor 34 receives a first bias voltage BIAS1. A diode-coupled transistor 36 has a drain electrode coupled to node B, a gate electrode coupled to the output of the maximum detection circuit 12 and a source electrode coupled to the second reference voltage VDD, via a P-channel transistor 38. The gate electrode of the P-channel transistor 38 receives a second bias voltage BIAS2.

The first bias voltage BIAS1 is chosen so that the current through the third N-channel transistor 34 is equal to twice the current through P-channel transistor 38. If these currents are small enough, the first 30 and second 32 N-channel transistors are working in the sub-threshold region. This means that if the voltage on the first input is greater than the voltage on the second input, by between 100–200 mV, the first N-channel transistor 30 is conducting current and the second N-channel transistor 32 is 'off'. Thus, the voltage at the first input is followed by the voltage on the source electrode of the first N-channel transistor 30, but is shifted down one threshold value (approximately), so that the voltage at node B is VMAX− VT, where VT is the threshold voltage. The diode-coupled transistor 36 shifts the voltage at node B up by one threshold value VT. Thus, the voltage at the output of the maximum detection circuit is approximately equal to the voltage at the first input, which is the greater of the voltages on the first and second inputs. An advantage of this arrangement is that even if the voltage at the first or second input approaches the voltage at the rails (VDD or ground) and even if the first or second input voltage is greater than the threshold voltage of the transistors VT, the voltage at node B ensures that first 30, second 32, third 34 and diode-coupled 36 transistors are held in saturation.

Figure 4:
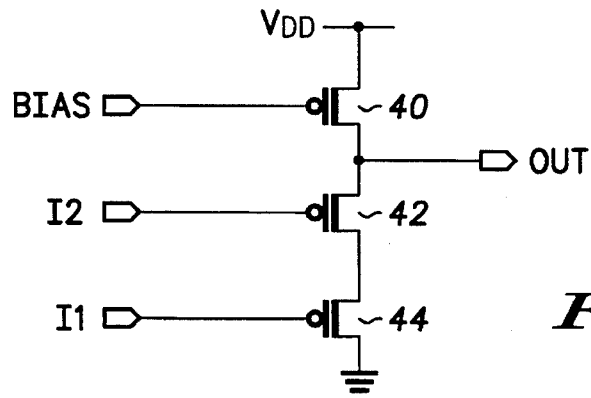
FIG. 4 is a schematic circuit diagram of a second maximum detection circuit for use in the circuit of FIG. 2.

Another implementation of the maximum detection circuit 12 is shown in FIG. 4. Three P-channel transistors 40, 42 and 44 are coupled in series between the second reference voltage VDD and ground GND. The gate electrode of the first transistor 40 receives a bias voltage BIAS, the gate electrode of the second transistor 42 is coupled to the second input of the maximum detection circuit and the gate electrode of the third transistor 44 is coupled to the first input of the maximum detector circuit. The second 42 and third 44 transistors have a zero threshold voltage. The bias voltage BIAS is chosen so that the second and third transistors 42 and 44 operate in the sub-threshold region. In this case, the voltage on the output of the maximum detection circuit is equal to the greater of the two voltages at the first and second inputs.

It will be appreciated that other implementations of the maximum detection circuit can be used in the driver circuit 8 and it is not intended to limit the invention to any one implementation.

Figure 5:
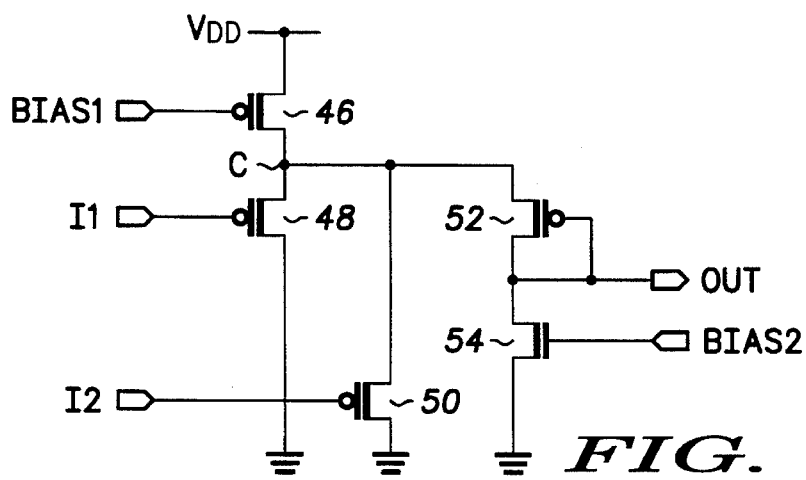
FIG. 5 is a schematic circuit diagram of a minimum detection circuit for use in the circuit of FIG. 2.

An example of an implementation of a minimum detector circuit is shown in FIG. 5.

A first P-channel transistor 46 has a gate electrode coupled to receive a first bias voltage BIAS1, a source electrode coupled to the second reference voltage VDD and a drain electrode coupled to a node C. A second P-channel transistor 48 has a gate electrode coupled to the first input of the minimum detector circuit, a source electrode coupled to node C and a drain electrode coupled to ground. A third P-channel transistor 50 has a gate electrode coupled to the second input of the minimum detector circuit, a source electrode coupled to node C and a drain electrode coupled to ground GND. A fourth diode-coupled P-channel transistor 52 has a gate electrode coupled to the output of the minimum detection circuit, a source electrode coupled to node C and a drain electrode coupled to the drain electrode of an N-channel transistor 54. The gate electrode of the N-channel transistor 54 receives a second bias voltage BIAS2.

The first bias voltage BIAS1 is selected so that the current through the first P-channel transistor 46 is equal to twice the current through N-channel transistor 54. If these currents are small enough, the second P-channel transistor 48 and third P-channel transistor 50 are operating in the sub-threshold region. If the voltage on the first input is less than the voltage on the second input, by between 100–200 mV, the second P-channel transistor 48 is conducting and the third P-channel transistor 50 is 'off'. Thus, the voltage at the first input is followed by the voltage on the source of the second P-channel transistor 48, but is shifted up one threshold value (approximately), so that the voltage at node C is equal to V MIN–VT, where VT is the threshold voltage. The fourth P-channel transistor 52 shifts the voltage at node C down a threshold value VT, so that the voltage at the output of the minimum detection circuit is approximately equal to the smaller of the voltages at the first and second inputs.

In the preferred embodiment the transistor switch 10 is a P-channel enhancement mode MOSFET transistor. However, the driver circuit can also be arranged to drive a N-channel enhancement mode MOSFET transistor. For an N-channel switch, VDD should be exchanged for ground GND and vice versa, P-channel transistors should be exchanged for N-channel transistors and vice versa, the maximum detector circuit 12 should be exchanged for the minimum detector circuit 14 and vice versa and the phases of the switch control signal should be inverted.

A second embodiment of the present invention relates to a driver circuit for switching differential transistor switches, such as those used in a differential switched capacitor circuit.

Figure 6:
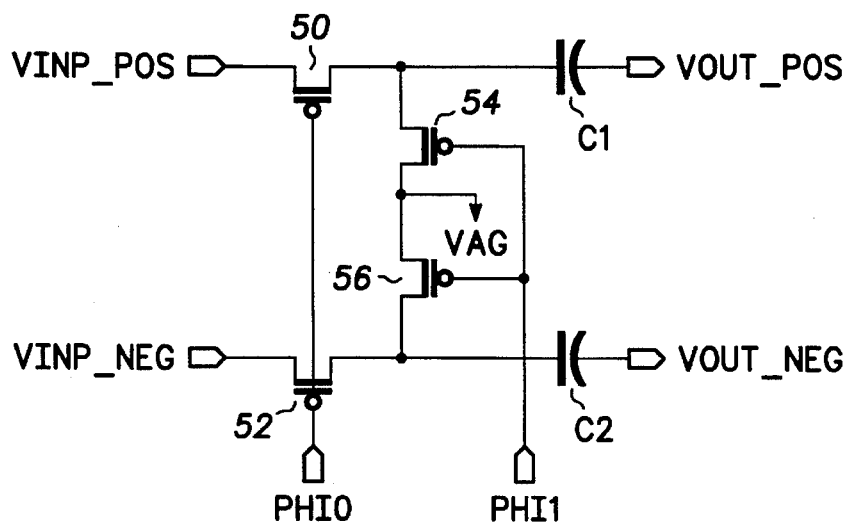
FIG. 6 is a schematic circuit diagram of a prior art differential switched capacitor circuit.

Part of a switched capacitor circuit using differential transistor switches is shown in FIG. 6. The circuit comprises two capacitors C1 and C2, which are connected to respective differential inputs VINP-POS and VINP-NEG, via transistor switches 50 and 52, and with analog ground VAG via transistors 54 and 56 respectively. The gates of the transistor switches 50 and 52 are coupled to receive a switch control signal PHI0 and the gates of transistors 54 and 56 are coupled to receive the inverse of the switch control signal PHI1.

When the switch control signal is low, capacitors C1 and C2 charge from the respective input signals VINP-POS and VINP-NEG. When the switch control signal is high, the capacitors C1 and C2 discharge to analog ground VAG. The outputs VOUT-POS and VOUT-NEG may be connected to the inputs of an operational amplifier or other switching stage, depending upon the application.

Since the voltages on the gates of transistor switches 50 and 52 are fixed, and the voltages on their drains and sources are changing according to the input signals, the source-drain on-resistances of these transistors are also changing according to the input signals. This produces unequal impedances in the VINP-POS to VOUT-POS and VINP-NEG to VOUT-NEG differential paths. Thus, the RC time constants for charging capacitors C1 and C2 are unequal.

Since the outputs VOUT-POS and VOUT-NEG are kept substantially at analog ground, or other signal independent voltage, due to the following switching stages, the on-resistances of the transistors 54 and 56 do not depend on the input signals.

As the RC time constants in the differential input paths are different, the charging of one of the capacitors (either C1 or C2) is faster than the other. A common mode input signal therefore charges one of the capacitors faster than the other.

This means that a common mode input signal produces a differential charge on capacitors C1 and C2, which is passed to the outputs VOUT-POS and VOUT-NEG, when the switch control signal is high. This causes degradation of the circuits common mode signal rejection capability and non-linear distortions.

Common mode rejection degradation is particularly problematical in mixed-signal IC's. In such IC's, the analog part must typically operate in extremely noisy digital environments. Digital noise and spikes penetrate to the analog part and are usually of the common mode nature. Such prior art circuits therefore have a low common mode rejection ratio and poor digital spike immunity.

As discussed above in relation to the known non-differential switched capacitor circuits, transistors 50 to 56 may be replaced by double transfer gates to provide larger input voltage ranges. However, the on-resistance of such double transfer gates still depends on the input signal, therefore such designs also suffer from the above described problems.

If the known driver circuit referred to above, which utilizes a charge pump to generate a gate-to-source voltage which is independent of the input signal, is used for a differential switched capacitor circuit, it would suffer from the same problems with respect to the excessive voltage stresses in the transistors due to the generation of voltages greater than the power supply.

The driver circuit in accordance with a second embodiment of the invention addresses these problems and at the same time, provides rail-to-rail operation without generating voltages greater than the supply voltage between any two adjacent nodes. It will be appreciated that to provide rail-to-rail operation, the gate voltage of the transistor switches may be lower than ground. However, the voltage difference between all adjacent circuit nodes is always kept at values which are not greater than the supply voltage. As with the first embodiment, the driver circuit operates with input signals which are slowly changing compared to the clock rate of the switch control signal.

Figure 7:
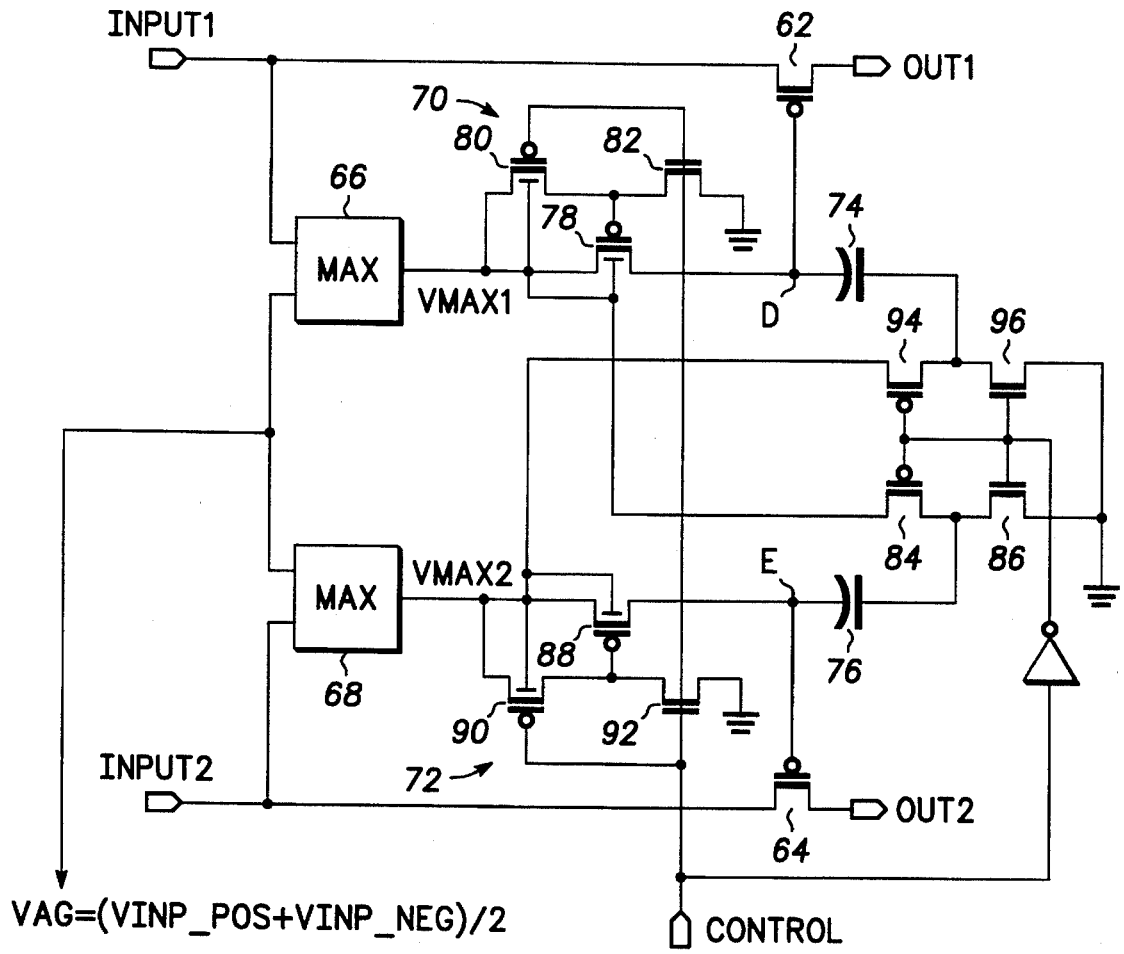
FIG. 7 is a second driver circuit in accordance with the present invention for switching differential transistor switches.

Referring now to FIG. 7, a driver circuit 60, in accordance with a second embodiment of the present invention, for driving transistor switches 62 and 64 is shown. FIG. 7 shows the driver circuit 60 and transistor switches 62 and 64. It will be appreciated, however, that the outputs OUT1 and OUT2 may be connected to transistors C1 and C2 as shown in FIG. 6.

Driver circuit 60 receives differential input signals VINP-POS and VINP-NEG at first INPUT1 and second INPUT2 inputs respectively. Driver circuit 60 comprises a first maximum detection circuit 66 and a second maximum detection circuit 68. The first maximum detection circuit has first and second inputs coupled respectively to the first input INPUT1 and to a first reference node which supplies a first reference voltage, analog ground VAG. The second maximum detection circuit 68 has first and second inputs coupled to analog ground VAG and the second input INPUT2, respectively. The output of the first maximum detection circuit 66 is selectively coupled to a node D, via a switch arrangement 70. Node D is coupled to the gate electrode of transistor switch 62. The output of the second maximum detection circuit 68 is selectively coupled to a node E, via a switch arrangement 72. Node E is coupled to the gate electrode of transistor switch 64.

A first voltage shifting means has an input selectively coupled to ground or to the output of the second maximum detection circuit 68 and an output coupled to node D. A second voltage shifting means has an input selectively coupled to ground or to the output of the first maximum detection circuit 66 and an output coupled to node E. Preferably, the first voltage shifting means comprises a first bootstrap capacitor 74 having one plate coupled to node D and another plate selectively coupled to ground or to the output of the second maximum detection circuit 68. Preferably, the second voltage shifting means comprises a second bootstrap capacitor 76 having one plate coupled to node E and another plate selectively coupled to ground or to the output of the first maximum detection circuit 66.

The first switch arrangement 70 comprises a P-channel transistor 78, whose current electrodes are coupled between the output VMAX1 of the first maximum detector circuit 66 and node E, and whose gate electrode is coupled to the drain electrodes of a P-channel transistor 80 and an N-channel transistor 82.

N-channel transistor 82 has a gate electrode coupled to receive the switch control signal CONTROL and a source electrode coupled to ground GND. The gate electrode of P-channel transistor 80 is also coupled to receive the switch control signal CONTROL and its source electrode is coupled to the output VMAX1 of the first maximum detector circuit 66. The bulk electrode of P-channel transistor 80 is coupled to the source electrode and bulk electrode of P-channel transistor 78, and to the source electrode of a P-channel transistor 84. The drain electrode of P-channel transistor 84 is connected to the drain electrode of an N-channel transistor 86, whose source electrode is coupled to ground GND. The gate electrodes of transistors 84 and 86 are coupled to receive the inverse of the switch control signal. The drain electrodes of transistors 84 and 86 are coupled to one plate of the second bootstrap capacitor 76.

The second switch arrangement 72 is similar to the first switch arrangement 70. The second switch arrangement 72 comprises a P-channel transistor 88, whose current electrodes are coupled between the output VMAX2 of the second maximum detector circuit 68 and node E, and whose gate electrode is coupled to the drain electrodes of a P-channel transistor 90 and a N-channel transistor 92.

N-channel transistor 92 has a gate electrode coupled to receive the switch control signal CONTROL and a source electrode coupled to ground GND. The gate electrode of P-channel transistor 90 is also coupled to receive the switch control signal CONTROL and its source electrode is coupled to the output of the second maximum detector circuit 68. The bulk electrode of P-channel transistor 90 is coupled to the source electrode and bulk electrode of P-channel transistor 88, and to the source electrode of a P-channel transistor 94. The drain electrode of P-channel transistor 94 is connected to the drain electrode of a N-channel transistor 96, whose source electrode is coupled to ground GND. The gate electrodes of transistors 94 and 96 are coupled to receive the inverse of the switch control signal. The drain electrodes of transistors 94 and 96 are coupled to one plate of the first bootstrap capacitor 74.

The differential input signals VINP-POS and VINP-NEG are changing relative to the first reference voltage level, analog ground VAG, at the first reference node. That is, the first reference voltage level VAG is equal to half the sum of the input voltage signals VINP-POS and VINP-NEG.

The operation of the driver circuit 60 will now be described.

When the switch control signal CONTROL is high, P-channel transistors 78 and 88 are conducting, and the gate electrodes of transistor switches 62 and 64 are connected to the outputs of the maximum detection circuits 66 and 68, respectively. Since the signal on the gate electrodes of transistors 84 and 94 is low, these transistors are conducting so that a plate of the bootstrap capacitor 74 is at the voltage level of the output VMAX2 of the second maximum detection circuit 68 and a plate of the bootstrap capacitor 76 is at the voltage level of the output VMAX1 of the first maximum detection circuit 66.

When the switch control signal CONTROL is low, the P-channel transistors 78 and 88 are 'off', and the N-channel transistors 86 and 96 are 'on', whereby the plates of bootstrap capacitors 74 and 64 drop by VMAX2–GND and VMAX1–GND, respectively.

By charge conservation, the voltage at node D becomes,

VMAX1–(VMAX2–GND)

and at node E, the voltage becomes

VMAX2–(VMAX1–GND)

The transistor switches 62 and 64 are therefore turned 'on'. It therefore follows that the gate-to-source voltage of transistor 62 ($V_{GS1}$) is, $$V_{GS1} = VINP\text{-}POS - VMAX1 + (VMAX2 - GND) \quad (4)$$

and the gate-to-source voltage of transistor 64 ($V_{GS2}$) is, $$V_{GS2} = VINP\text{-}NEG - VMAX2 + (VMAX1 - GND) \quad (5)$$

On rearranging, these equations become, $$\begin{aligned} V_{GS1} &= VINP - POS - GND - (VMAX1 - VMAX2) \\ &= VINP - POS - GND - K1 \end{aligned} \quad (6)$$

and, $$\begin{aligned} V_{GS2} &= VINP - NEG - GND + (VMAX1 - VMAX2) \\ &= VINP - NEG - GND + K2 \end{aligned} \quad (7)$$

Since $$VAG = \frac{VINP - POS + VINP - NEG}{2} \quad (8)$$

$$K1 = VINP - POS - VAG \quad (9)$$

And, $$K2 = VAG - VINP - NEG \quad (10)$$

Substituting equations 9 and 10 in equations 6 and 7 respectively, the gate-to-source voltages are, $$V_{GS1} = VAG - GND$$

$$V_{GS2} = VAG - GND$$

Thus, in both differential paths the gate-to-source voltages, $V_{GS1}$ and $V_{GS2}$, are both independent of the input signals. Thus, when the transistor switches 62 and 64 are open, the on-resistances of these transistors are independent of the input signals.

Implementations of the maximum detection circuits 66 and 68 are shown in, and described with reference to, FIGS. 3 and 4.

Figure 8:
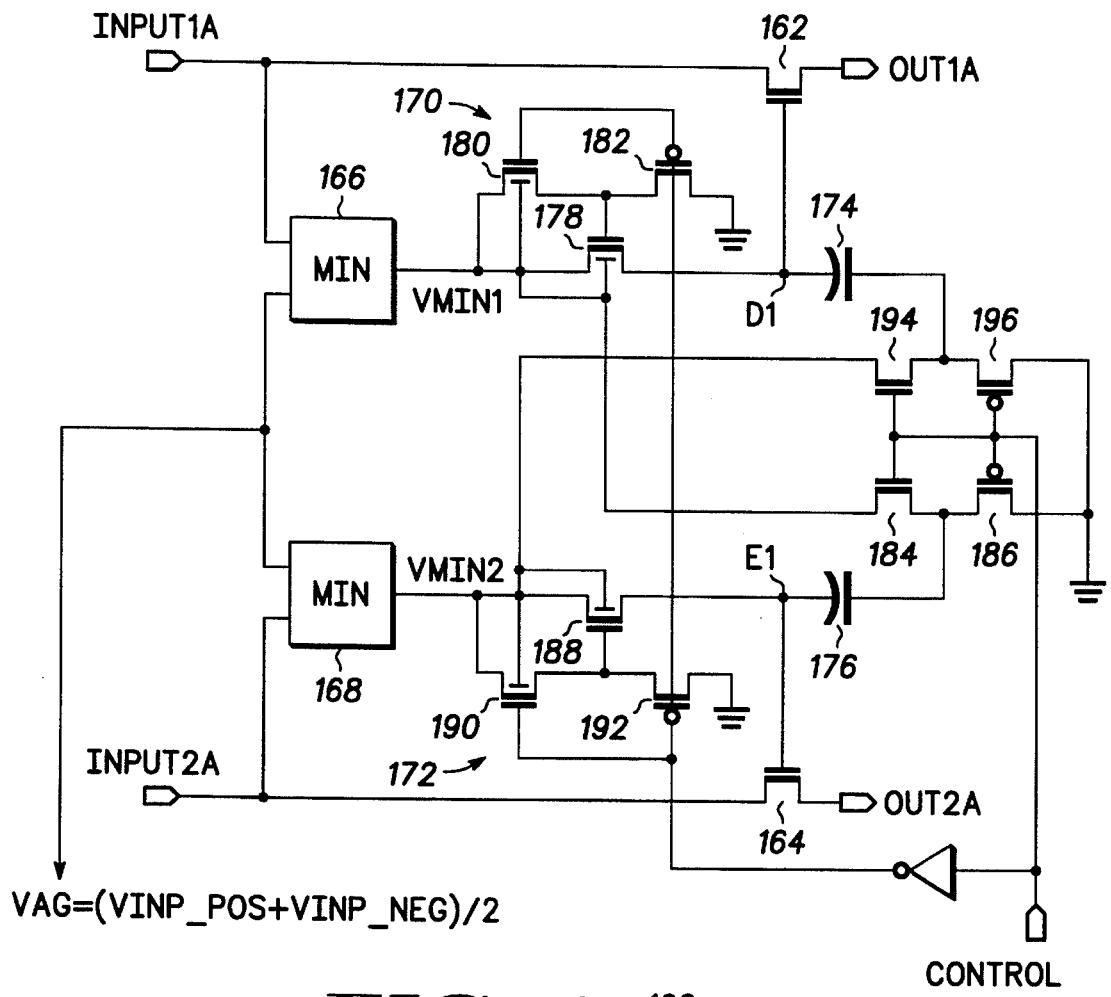
FIG. 8 is a driver circuit for switching differential transistor switches in accordance with an embodiment of the present invention.

Although the second embodiment has been described with respect to P-channel transistor switches, the driver circuit in accordance with the invention can be used to drive N-channel transistor switches. In this case, VDD should be exchanged for GND and vice versa, P-channel transistors should be exchanged for N-channel transistors and vice versa, the maximum detection circuits should be exchanged for minimum detection circuits, and the phases of the switch control signals should be inverted shown in FIG. 8. Referring now to FIG. 8, a driver circuit 160, in accordance with a third embodiment of the present invention, for driving transistor switches 162 and 164 is shown. FIG. 8 shows the driver circuit 160 and transistor switches 162 and 164. It will be appreciated, however, that the outputs OUT1A and OUT2A may be connected to transistors C1 and C2 as shown in FIG. 6.

Driver circuit 160 receives differential input signals VINP-POS and VINP-NEG at first INPUT1A and second INPUT2A inputs respectively. Driver circuit 160 comprises a first minimum detection circuit 166 and a second minimum detection circuit 168. The first minimum detection circuit has first and second inputs coupled respectively to the first input INPUT1A and to a first reference node which supplies a first reference voltage, analog ground VAG. The second minimum detection circuit 168 has first and second inputs coupled to analog ground VAG and the second input INPUT2A, respectively. The output of the first minimum detection circuit 166 is selectively coupled to a node D1, via a switch arrangement 170. Node D1 is coupled to the gate electrode of transistor switch 162. The output of the second minimum detection circuit 168 is selectively coupled to a node E1, via a switch arrangement 172. Node E1 is coupled to the gate electrode of transistor switch 164.

A first voltage shifting means has an input selectively coupled to ground or to the output of the second minimum detection circuit 168 and an output coupled to node D1. A second voltage shifting means has an input selectively coupled to ground or to the output of the first minimum detection circuit 166 and an output coupled to node E1. Preferably, the first voltage shifting means comprises a first bootstrap capacitor 174 having one plate coupled to node D1 and another plate selectively coupled to ground or to the output of the second minimum detection circuit 168. Preferably, the second voltage shifting means comprises a second bootstrap capacitor 176 having one plate coupled to node E1 and another plate selectively coupled to ground or to the output of the first minimum detection circuit 166.

The first switch arrangement 170 comprises an N-channel transistor 178, whose current electrodes are coupled between the output VMIN1 of the first minimum detector circuit 166 and node E1, and whose gate electrode is coupled to the drain electrodes of an N-channel transistor 180 and a P-channel transistor 182.

P-channel transistor 182 has a gate electrode coupled to receive the switch control signal $\overline{\text{CONTROL}}$ and a source electrode coupled to VDD. The gate electrode of N-channel transistor 180 is also coupled to receive the switch control signal $\overline{\text{CONTROL}}$ and its source electrode is coupled to the output VMIN1 of the first minimum detector circuit 166. The bulk electrode of N-channel transistor 180 is coupled to the source electrode and bulk electrode of N-channel transistor 178, and to the source electrode of an N-channel transistor 184. The drain electrode of N-channel transistor 184 is connected to the drain electrode of a P-channel transistor 186, whose source electrode is coupled to VDD. The gate electrodes of transistors 184 and 186 are coupled to receive the inverse of the switch control signal, i.e., control signal CONTROL. The drain electrodes of transistors 184 and 186 are coupled to one plate of the second bootstrap capacitor 176.

The second switch arrangement 172 is similar to the first switch arrangement 170. The second switch arrangement 172 comprises an N-channel transistor 188, whose current electrodes are coupled between the output VMIN2 of the second minimum detector circuit 168 and node E1, and whose gate electrode is coupled to the drain electrodes of an N-channel transistor 190 and a P-channel transistor 192.

N-channel transistor 192 has a gate electrode coupled to receive the switch control signal $\overline{\text{CONTROL}}$ and a source electrode coupled to VDD. The gate electrode of N-channel transistor 190 is also coupled to receive the switch control signal $\overline{\text{CONTROL}}$ and its source electrode is coupled to the output of the second minimum detector circuit 168. The bulk electrode of N-channel transistor 190 is coupled to the source electrode and bulk electrode of N-channel transistor 188, and to the source electrode of an N-channel transistor 194. The drain electrode of N-channel transistor 194 is connected to the drain electrode of a P-channel transistor 196, whose source electrode is coupled to VDD. The gate electrodes of transistors 194 and 196 are coupled to receive the inverse of the switch control signal, i.e., control signal CONTROL. The drain electrodes of transistors 194 and 196 are coupled to one plate of the first bootstrap capacitor 174.

The differential input signals VINP-POS and VINP-NEG are changing relative to the first reference voltage level, analog ground VAG, at the first reference node. That is, the first reference voltage level VAG is equal to half the sum of the input voltage signals VINP-POS and VINP-NEG. Another implementation of a minimum detection circuit is shown in, and described with reference to, FIG. 5.

We claim:

1. A driver circuit for switching a transistor from a first state in which the transistor switch is closed such that an input signal is transferred to an output and a second state in which the transistor switch is open, the driver circuit comprises:

a first reference node for receiving a first reference voltage signal;

a second reference node for receiving a second reference voltage signal;

maximum detection means coupled to receive the input signal and the first reference voltage signal and for providing at an output the greater of the two signals, the output of the maximum detection means being selectively coupled to the gate electrode of the transistor switch;

minimum detection means coupled to receive the input signal and the first reference voltage signal and for providing at an output the lesser of the two signals;

voltage shifting means having an input selectively coupled to the second reference node and to the output of the minimum detection means and an output coupled to the gate electrode of the transistor switch;

wherein in the second state the output of the maximum detection means is coupled to the gate electrode of the transistor switch and the output of the voltage shifting means and the input of the voltage shifting means is coupled to the second reference voltage signal, and wherein in the first state, the output of the minimum detection means is coupled to the input of the voltage shifting means such that the output of the voltage shifting means is shifted by the minimum output signal to a voltage level which corresponds to the difference between the second reference voltage signal and the minimum output signal such that the voltage on the gate electrode of the transistor switch is dependent on the maximum output signal and the signal at the output of the voltage shifting means, whereby the gate-to-source voltage of the transistor switch is independent of the input signal.

2. A driver circuit according to claim 1 wherein the driver circuit switches the transistor switch between the first state and the second state in response to a switching signal have a first signal level and a second signal level respectively, and wherein the driver circuit further comprises:

a first switch coupled to receive the switching signal and coupled between the output of the maximum detection means and the gate electrode of the transistor switch such that when the switching signal has the second signal level the first switch is closed and the maximum output signal is coupled to the gate electrode and when the switching signal has the first signal level the first switch is open; and a second switch coupled to receive the inverse of the switching signal and coupled between the output of the minimum detection means and the input of the voltage shifting means such that when the switching signal has the second signal level, the second switch is open and when the switching signal has the first signal level, the second switch is closed and the minimum output signal is coupled to the input of the voltage shifting means.

3. A driver circuit according to claim 2 wherein the first switch comprises:

a first transistor of a first conductivity type and having a first current electrode coupled to the output of the maximum detection means, a second current electrode coupled to the gate electrode of the transistor switch, a bulk electrode coupled to the first current electrode and a gate electrode;

a second transistor of the first conductivity type having a first current electrode coupled to the output of the maximum detection means, a second current electrode coupled to the gate electrode of the first transistor, a bulk electrode coupled to the bulk electrode of the first transistor and a gate electrode coupled to receive the switching signal; and a third transistor of a second conductivity type having a first current electrode coupled to the gate electrode of the first transistor, a second current electrode coupled to a third reference voltage supply and a gate electrode coupled to receive the switching signal.

4. A driver circuit according to claim 2 further comprising a third switch coupled to receive the inverted switching signal and coupled between the second reference node and the input of the voltage shifting means such that when the switching signal has the second signal level, the third switch is closed and the second reference voltage signal is coupled to the input of the voltage shifting means and when the switching signal has the first signal level, the third switch is open.

5. A driver circuit according to claim 1 wherein the voltage shifting means comprises a capacitor, one plate forming the input of the voltage shifting means and the other plate forming the output of the voltage shifting means.

6. A driver circuit according to claim 1 wherein the maximum detection means has a first input for receiving the input signal and a second input for receiving the first reference voltage signal and comprises:

a first transistor having a first current electrode coupled to the second reference voltage node, a second current electrode coupled to a node and a gate electrode coupled to the first input;

a second transistor having a first current electrode coupled to the second reference voltage node, a second current electrode coupled to the node and a gate electrode coupled to the second input;

a third diode-coupled transistor having a first current electrode coupled to the node, a gate electrode and a second current electrode coupled to the second reference voltage node, the gate electrode and the output of the maximum detection means; and a current supply means for supplying a current to the node such that the first and second transistors operate in the sub-threshold region whereby the greater of the voltage signals at the first and second inputs is mirrored to the output of the maximum detection means.

7. A driver circuit according to claim 1 wherein the maximum detection means has a first input for receiving the input signal and a second input for receiving the first reference voltage signal and comprises:

a first transistor having a first current electrode, a second current electrode coupled to a third reference voltage node and a gate electrode coupled to the first input;

a second transistor having a first current electrode coupled to the output of the maximum detection means, a second current electrode coupled to the first current electrode of the first transistor and a gate electrode coupled to the second input;

a current supply means coupled to the first current electrode of the second transistor for supplying current thereto such that the first and second transistors operate in the sub-threshold region whereby the greater of the voltage signals at the first and second inputs is outputted to the output of the maximum detection means.

8. A driver circuit according to claim 1 wherein the minimum detection means has a first input for receiving the input signal and a second input for receiving the first reference voltage signal and comprises:

a first transistor having a first current electrode coupled to a third reference voltage node, a second current electrode coupled to a node and a gate electrode coupled to the first input;

a second transistor having a first current electrode coupled to the third reference voltage node, a second current electrode coupled to the node and a gate electrode coupled to the second input;

a third diode-coupled transistor having a first current electrode coupled to the node, a gate electrode and a second current electrode coupled to the third reference voltage node, the gate electrode and the output of the minimum detection means; and a current supply means for supplying a current to the node such that the first and second transistors operate in the sub-threshold region whereby the smaller of the voltage signals at the first and second inputs is mirrored to the output of the minimum detection means.

9. A driver circuit for a differential switched capacitor circuit, the driver circuit being arranged to switch a pair of differential transistor switches from a first state in which the switches are closed such that respective first and second input signals, which form therebetween a differential input signal, are transferred to first and second outputs thereof and a second state in which the switches are open, the driver circuit comprising:

a first reference node for receiving a first reference voltage signal, the first reference voltage signal having a level substantially equal to half the sum of the first and second input signals;

a second reference node for receiving a second reference voltage signal;

first maximum detection means coupled to receive the first input signal and the first reference voltage signal and for providing at an output the greater of the two signals, the output of the first maximum detection means being selectively coupled to the gate electrode of a first transistor switch of the pair of transistor switches;

second maximum detection means coupled to receive the second input signal and the first reference voltage signal and for providing at an output the greater of the two signals, the output of the second maximum detection means being selectively coupled to the gate electrode of a second transistor switch of the pair;

first voltage shifting means having an input selectively coupled between the second reference node and the output of the second maximum detection means and an output coupled to the gate electrode of the first transistor switch;

second voltage shifting means having an input selectively coupled between the second reference node and the output of the first maximum detection means and an output coupled to the gate electrode of the second transistor switch;

wherein in the second state the output of the first maximum detection means is coupled to the gate electrode of the first transistor switch, the output of the first voltage shifting means and the input of the second voltage shifting means and the output of the second maximum detection means is coupled to the gate electrode of the second transistor switch, the output of the second voltage shifting means and the input of the first voltage shifting means, and wherein in the first state, the inputs of the first and second voltage shifting means are coupled to the second reference node such that the outputs of the first and second voltage shifting means are each shifted by the second reference voltage signal to voltage levels which correspond to the difference between the second maximum output signal and the second reference voltage signal, and the first maximum output signal and the second reference voltage signal, respectively, such that the voltages on the gate electrodes of the first and second transistor switches are dependent on the first maximum output signal and the output of the first voltage shifting means, and second maximum output signal and the output of the second voltage shifting means, respectively, whereby the gate-to-source voltages of the first and second transistor switches are independent of the differential input signal.

10. A driver circuit according to claim 9 wherein the driver circuit switches the first and second transistor switches between the first state and the second state in response to a switching signal have a first signal level and a second signal level respectively, and wherein the driver circuit further comprises:

a first switch coupled to receive the switching signal and coupled between the output of the first maximum detection means and the gate electrode of the first transistor switch such that when the switching signal has the second signal level, the first switch is closed and the first maximum output signal is coupled to the gate electrode of the first transistor switch and when the switching signal has the first signal level, the first switch is open;

a second switch coupled to receive the switching signal and coupled between the output of the second maximum detection means and the gate electrode of the second transistor switch such that when the switching signal has the second signal level, the second switch is closed and the second maximum output signal is coupled to the gate electrode of the second transistor switch and when the switching signal has the second signal level, the second switch is open;

third switch means coupled to receive the inverse of the switching signal and coupled between the output of the second maximum detection means and the input of the first voltage shifting means and between the second reference node and the input of the first voltage shifting means, such that when the switching signal has the second signal level, the second maximum output signal is coupled to the input of the first voltage shifting means and when the switching signal has the first signal level, the second reference voltage signal is coupled to the input of the first voltage shifting means; and fourth switch means coupled to receive the inverse of the switching signal and coupled between the output of the first maximum detection means and the input of the second voltage shifting means and between the second reference node and the input of the second voltage shifting means, such that when the switching signal has the second signal level, the first maximum output signal is coupled to the input of the second voltage shifting means and when the switching signal has the first signal level, the second reference voltage signal is coupled to the input of the second voltage shifting means.

11. A driver circuit according to claim 10 wherein the first switch comprises:

a first transistor of a first conductivity type and having a first current electrode coupled to the output of the first maximum detection means, a second current electrode coupled to the gate electrode of the first transistor switch, a bulk electrode coupled to the first current electrode and a gate electrode;

a second transistor of the first conductivity type having a first current electrode coupled to the output of the first maximum detection means, a second current electrode coupled to the gate electrode of the first transistor, a bulk electrode coupled to the bulk electrode of the first transistor and a gate electrode coupled to receive the switching signal; and a third transistor of a second conductivity type having a first current electrode coupled to the gate electrode of the first transistor, a second current electrode coupled to the second reference node and a gate electrode coupled to receive the switching signal, and wherein the second switch comprises:

a fourth transistor of the first conductivity type and having a first current electrode coupled to the output of the second maximum detection means, a second current electrode coupled to the gate electrode of the second transistor switch, a bulk electrode coupled to the first current electrode and a gate electrode;

a fifth transistor of the first conductivity type having a first current electrode coupled to the output of the second maximum detection means, a second current electrode coupled to the gate electrode of the fourth transistor, a bulk electrode coupled to the bulk electrode of the fourth transistor and a gate electrode coupled to receive the switching signal; and a sixth transistor of the second conductivity type having a first current electrode coupled to the gate electrode of the fourth transistor, a second current electrode coupled to the second reference node and a gate electrode coupled to receive the switching signal.

12. A driver circuit according to claim 10 wherein the third switch means comprises:

a first transistor of the first conductivity type having a first current electrode coupled to the output of the second maximum detection means, a second current electrode coupled to the input of the first voltage shifting means and a gate electrode coupled to receive the inverse of the switching signal; and a second transistor of the second conductivity type having a first current electrode coupled to the input of the first voltage shifting means, a second current electrode coupled to the second reference voltage node and a gate electrode coupled to receive the inverse of the switching signal, and wherein the fourth switch means comprises:

a third transistor of the first conductivity type having a first current electrode coupled to the output of the first maximum detection means, a second current electrode coupled to the input of the second voltage shifting means and a gate electrode coupled to receive the inverse of the switching signal; and a fourth transistor of the second conductivity type having a first current electrode coupled to the input of the second voltage shifting means, a second current electrode coupled to the second reference voltage node and a gate electrode coupled to receive the inverse of the switching signal.

13. A driver circuit according to claim 9 wherein the each one of the first and second voltage shifting means comprise a capacitor, one plate forming the input of the voltage shifting means and the other plate forming the output of the voltage shifting means.

14. A driver circuit according to claim 9 wherein the first and second maximum detection means each have a first input for receiving the respective input signal and a second input for receiving the first reference voltage signal and comprises:

a first transistor having a first current electrode coupled to a third reference voltage node, a second current electrode coupled to a node and a gate electrode coupled to the first input;

a second transistor having a first current electrode coupled to the third reference voltage node, a second current electrode coupled to the node and a gate electrode coupled to the second input;

a third diode-coupled transistor having a first current electrode coupled to the node, a gate electrode and a second current electrode coupled to the third reference voltage node, the gate electrode and the output of the maximum detection means; and a current supply means for supplying a current to the node such that the first and second transistors operate in the sub-threshold region whereby the greater of the voltage signals at the first and second inputs is mirrored to the output of the maximum detection means.

15. A driver circuit according to claim 9 wherein the first and second maximum detection means each have a first input for receiving the respective input signal and a second input for receiving the first reference voltage signal and comprises:

a first transistor having a first current electrode, a second current electrode coupled to the second reference voltage node and a gate electrode coupled to the first input;

a second transistor having a first current electrode coupled to the output of the maximum detection means, a second current electrode coupled to the first current electrode of the first transistor and a gate electrode coupled to the second input;

a current supply means coupled to the first current electrode of the second transistor for supplying current thereto such that the first and second transistors operate in the sub-threshold region whereby the greater of the voltage signals at the first and second inputs is outputted to the output of the maximum detection means.

16. A driver circuit for a differential switched capacitor circuit, the driver circuit being arranged to switch a pair of differential transistor switches from a first state in which the switches are closed such that respective first and second input signals, which form therebetween a differential input signal, are transferred to first and second outputs thereof and a second state in which the switches are open, the driver circuit comprising:

a first reference node for receiving a first reference voltage signal, the first reference voltage signal having a level substantially equal to half the sum of the first and second input signals;

a second reference node for receiving a second reference voltage signal;

first minimum detection means coupled to receive the first input signal and the first reference voltage signal and for providing at an output the lesser of the two signals, the output of the first minimum detection means being selectively coupled to the gate electrode of a first transistor switch of the pair of transistor switches;

second minimum detection means coupled to receive the second input signal and the first reference voltage signal and for providing at an output the lesser of the two signals, the output of the second minimum detection means being selectively coupled to the gate electrode of a second transistor switch of the pair;

first voltage shifting means having an input selectively coupled between the second reference node and the output of the second minimum detection means and an output coupled to the gate electrode of the first transistor switch;

second voltage shifting means having an input selectively coupled between the second reference node and the output of the first minimum detection means and an output coupled to the gate electrode of the second transistor switch;

wherein in the second state the output of the first minimum detection means is coupled to the gate electrode of the first transistor switch, the output of the first voltage shifting means and the input of the second voltage shifting means and the output of the second minimum detection means is coupled to the gate electrode of the second transistor switch, the output of the second voltage shifting means and the input of the first voltage shifting means, and wherein in the first state, the inputs of the first and second voltage shifting means are coupled to the second reference node such that the outputs of the first and second voltage shifting means are each shifted by the second reference voltage signal to voltage levels which correspond to the difference between the second minimum output signal and the second reference voltage signal, and the first minimum output signal and the second reference voltage signal, respectively, such that the voltages on the gate electrodes of the first and second transistor switches are dependent on the first minimum output signal and the output of the first voltage shifting means, and second minimum output signal and the output of the second voltage shifting means, respectively, whereby the gate-to-source voltages of the first and second transistor switches are independent of the differential input signal.

17. A driver circuit according to claim 16 wherein the driver circuit switches the first and second transistor switches between the first state and the second state in response to a switching signal have a first signal level and a second signal level respectively, and wherein the driver circuit further comprises:

a first switch coupled to receive the switching signal and coupled between the output of the first minimum detection means and the gate electrode of the first transistor switch such that when the switching signal has the second signal level, the first switch is closed and the first minimum output signal is coupled to the gate electrode of the first transistor switch and when the switching signal has the first signal level, the first switch is open;

a second switch coupled to receive the switching signal and coupled between the output of the second minimum detection means and the gate electrode of the second transistor switch such that when the switching signal has the second signal level, the second switch is closed and the second minimum output signal is coupled to the gate electrode of the second transistor switch and when the switching signal has the second signal level, the second switch is open;

third switch means coupled to receive the inverse of the switching signal and coupled between the output of the second minimum detection means and the input of the first voltage shifting means and between the second reference node and the input of the first voltage shifting means, such that when the switching signal has the second signal level, the second minimum output signal is coupled to the input of the first voltage shifting means and when the switching signal has the first signal level, the second reference voltage signal is coupled to the input of the first voltage shifting means; and fourth switch means coupled to receive the inverse of the switching signal and coupled between the output of the first minimum detection means and the input of the second voltage shifting means and between the second reference node and the input of the second voltage shifting means, such that when the switching signal has the second signal level, the first minimum output signal is coupled to the input of the second voltage shifting means and when the switching signal has the first signal level, the second reference voltage signal is coupled to the input of the second voltage shifting means.

18. A driver circuit according to claim 17 wherein the first switch comprises:

a first transistor of a first conductivity type and having a first current electrode coupled to the output of the first minimum detection means, a second current electrode coupled to the gate electrode of the first transistor switch, a bulk electrode coupled to the first current electrode and a gate electrode;

a second transistor of the first conductivity type having a first current electrode coupled to the output of the first minimum detection means, a second current electrode coupled to the gate electrode of the first transistor, a bulk electrode coupled to the bulk electrode of the first transistor and a gate electrode coupled to receive the switching signal; and a third transistor of a second conductivity type having a first current electrode coupled to the gate electrode of the first transistor, a second current electrode coupled to the second reference node and a gate electrode coupled to receive the switching signal, and wherein the second switch comprises:

a fourth transistor of the first conductivity type and having a first current electrode coupled to the output of the second minimum detection means, a second current electrode coupled to the gate electrode of the second transistor switch, a bulk electrode coupled to the first current electrode and a gate electrode;

a fifth transistor of the first conductivity type having a first current electrode coupled to the output of the second minimum detection means, a second current electrode coupled to the gate electrode of the fourth transistor, a bulk electrode coupled to the bulk electrode of the fourth transistor and a gate electrode coupled to receive the switching signal; and a sixth transistor of the second conductivity type having a first current electrode coupled to the gate electrode of the fourth transistor, a second current electrode coupled to the second reference node and a gate electrode coupled to receive the switching signal.

19. A driver circuit according to claim 17 wherein the third switch means comprises:

a first transistor of the first conductivity type having a first current electrode coupled to the output of the second minimum detection means, a second current electrode coupled to the input of the first voltage shifting means and a gate electrode coupled to receive the inverse of the switching signal; and a second transistor of the second conductivity type having a first current electrode coupled to the input of the first voltage shifting means, a second current electrode coupled to the second reference voltage node and a gate electrode coupled to receive the inverse of the switching signal, and wherein the fourth switch means comprises:

a third transistor of the first conductivity type having a first current electrode coupled to the output of the first minimum detection means, a second current electrode coupled to the input of the second voltage shifting means and a gate electrode coupled to receive the inverse of the switching signal; and a fourth transistor of the second conductivity type having a first current electrode coupled to the input of the second voltage shifting means, a second current electrode coupled to the second reference voltage node and a gate electrode coupled to receive the inverse of the switching signal.

20. A driver circuit according to claim 16 wherein the each one of the first and second voltage shifting means comprise a capacitor, one plate forming the input of the voltage shifting means and the other plate forming the output of the voltage shifting means.

21. A driver circuit according to claim 16 wherein the first and second minimum detection means each have a first input for receiving the respective input signal and a second input for receiving the first reference voltage signal and comprises:
- a first transistor having a first current electrode coupled to the second reference voltage node, a second current electrode coupled to a node and a gate electrode coupled to the first input;
- a second transistor having a first current electrode coupled to the second reference voltage node, a second current electrode coupled to the node and a gate electrode coupled to the second input;
- a third diode-coupled transistor having a first current electrode coupled to the node, a gate electrode and a second current electrode coupled to the second reference voltage node, the gate electrode and the output of the minimum detection means; and
- a current supply means for supplying a current to the node such that the first and second transistors operate in the sub-threshold region whereby the smaller of the voltage signals at the first and second inputs is mirrored to the output of the minimum detection means.

* * * * *